United States Patent [19]

Kazerounian et al.

[11] Patent Number: 5,006,974
[45] Date of Patent: Apr. 9, 1991

[54] ON-CHIP HIGH VOLTAGE GENERATOR AND REGULATOR IN AN INTEGRATED CIRCUIT

[75] Inventors: Reza Kazerounian, Alameda; Syed Ali, Cupertino; Boaz Eitan, Sunnyvale, all of Calif.

[73] Assignee: WaferScale Integration Inc., Fremont, Calif.

[21] Appl. No.: 516,025

[22] Filed: Apr. 27, 1990

Related U.S. Application Data

[62] Division of Ser. No. 137,782, Dec. 24, 1987.

[51] Int. Cl.$^5$ ............................................. H02M 7/25
[52] U.S. Cl. ..................................... 363/60; 363/68; 323/281; 357/51
[58] Field of Search ........................... 363/60, 61, 68; 323/280, 281; 357/14, 41, 51; 361/303, 305, 328-330

[56] References Cited

U.S. PATENT DOCUMENTS

| | | |
|---|---|---|
| 3,845,331 | 10/1974 | Luscher ................................ 363/60 |
| 4,167,035 | 9/1979 | Willard ................................. 363/68 |
| 4,559,548 | 12/1985 | Iizuka et al. ......................... 363/60 |

Primary Examiner—Peter S. Wong
Attorney, Agent, or Firm—Skjerven, Morrill, MacPherson, Franklin & Friel

[57] ABSTRACT

An EEPROM constructed in accordance with our invention includes a voltage multiplier for generating an erase voltage and a voltage regulator circuit for controlling the magnitude of the erase voltage. The voltage regulator circuit includes means for providing a first voltage proportional to the erase voltage, means for providing a reference voltage on a reference voltage lead, and means for controlling the voltage multiplier circuit so that if the first voltage is less than the reference voltage, the voltage multiplier circuit will increase the erase voltage, but if the first voltage is greater than the reference voltage, the voltage multiplier will not continue to increase the erase voltage. The voltage multiplier includes novel capacitors and transistors constructed using standard EEPROM processing to withstand high voltages without breaking down.

11 Claims, 10 Drawing Sheets

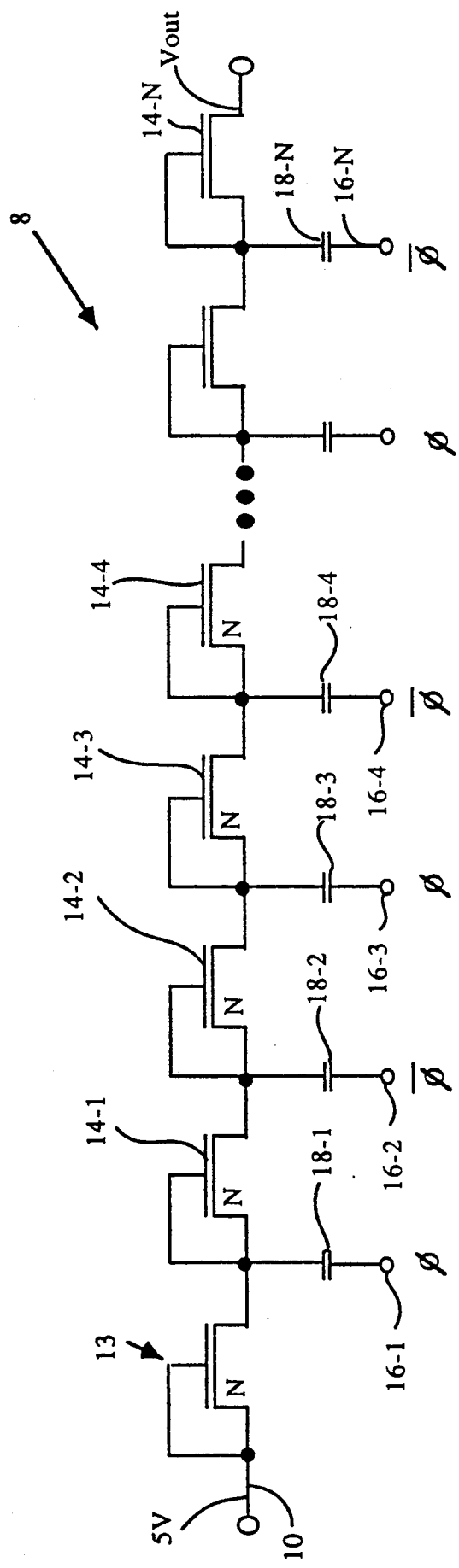
FIG._1.
(prior art)

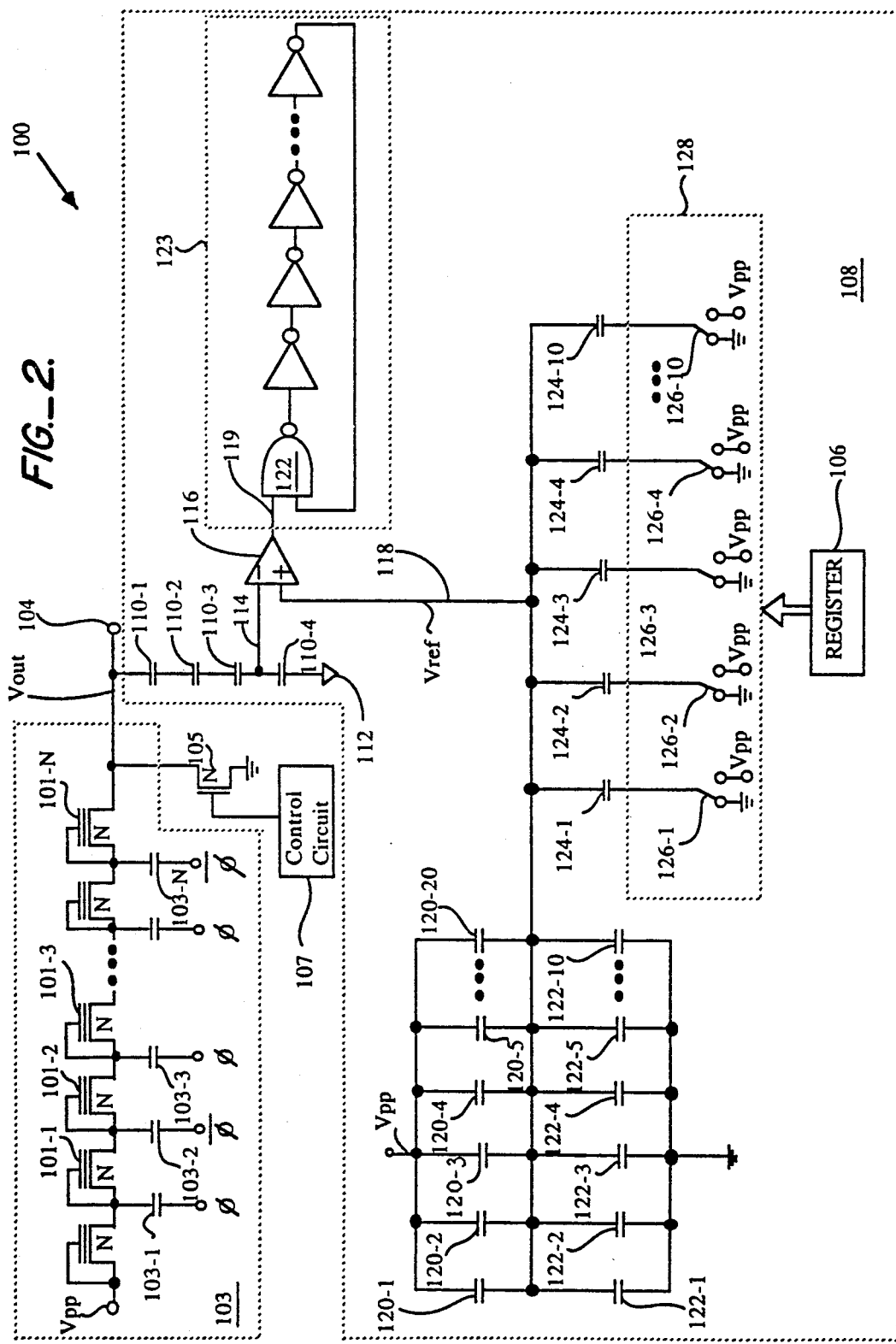
FIG._2.

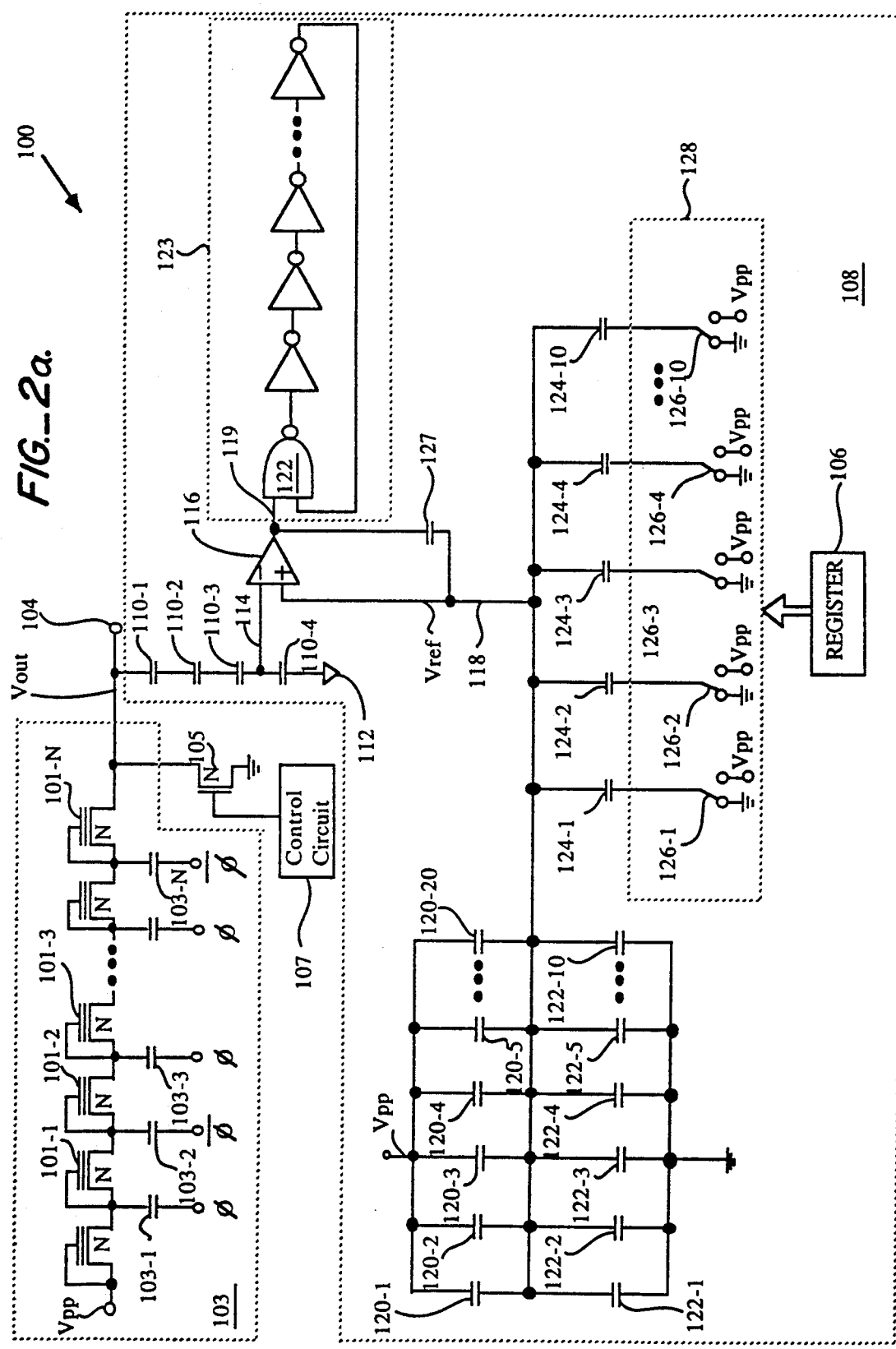
FIG._2a.

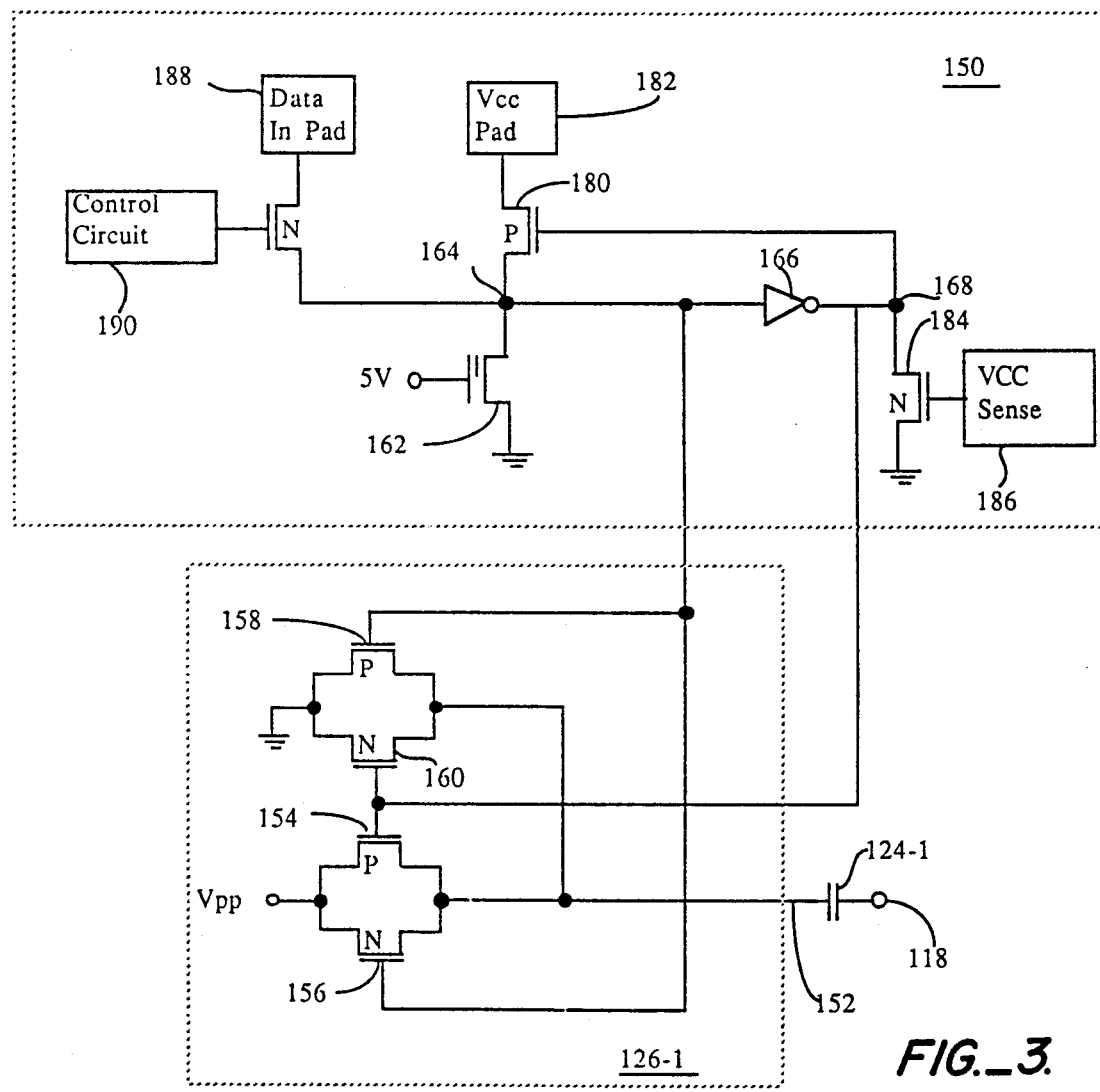
FIG._3.

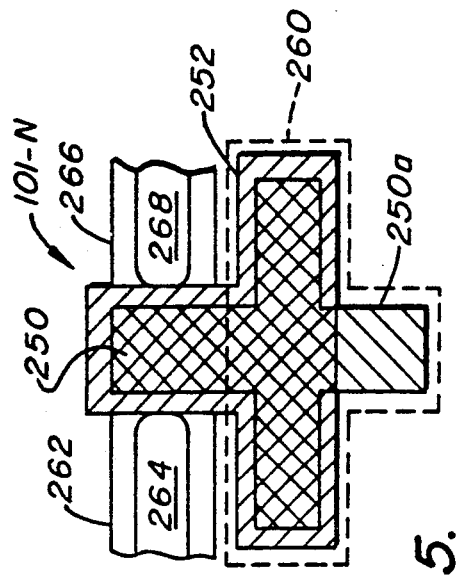
FIG._5.
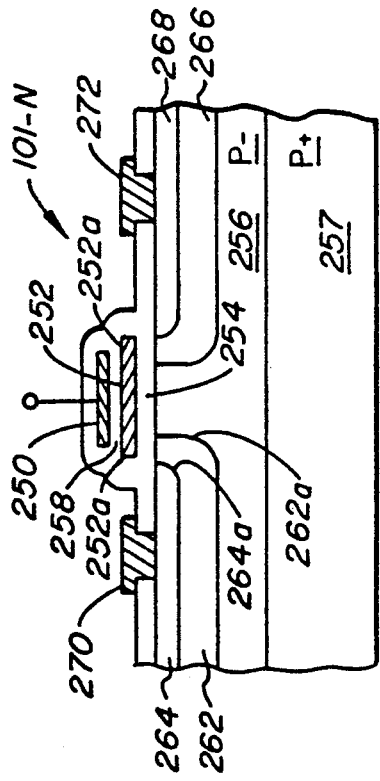
FIG._4.
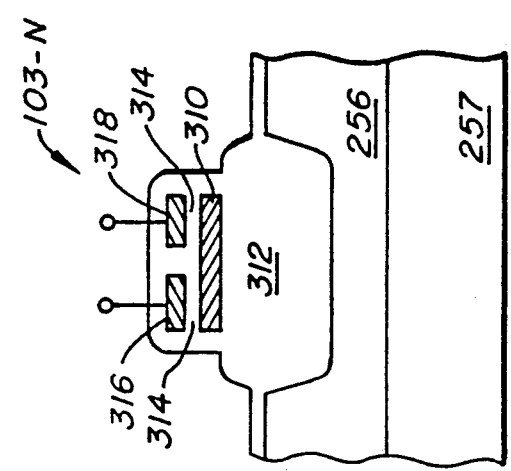
FIG._7.
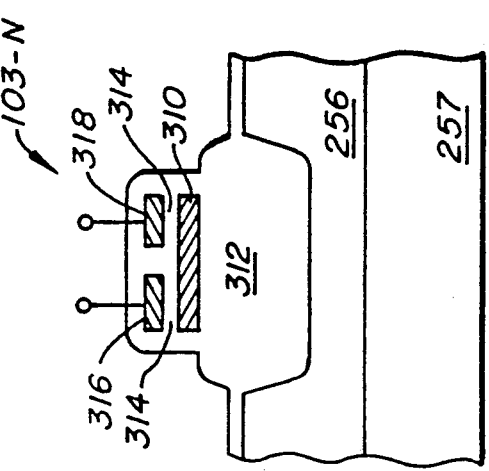
FIG._6.

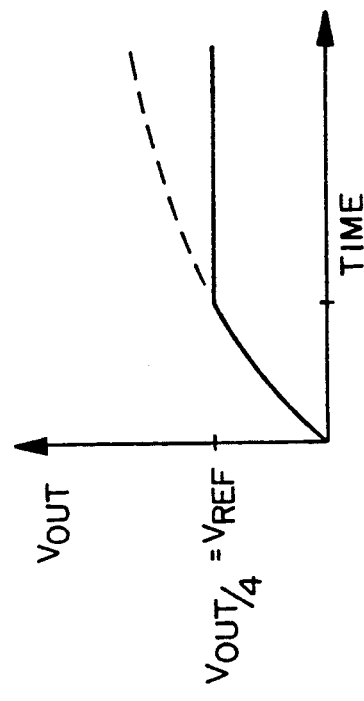
FIG._11.
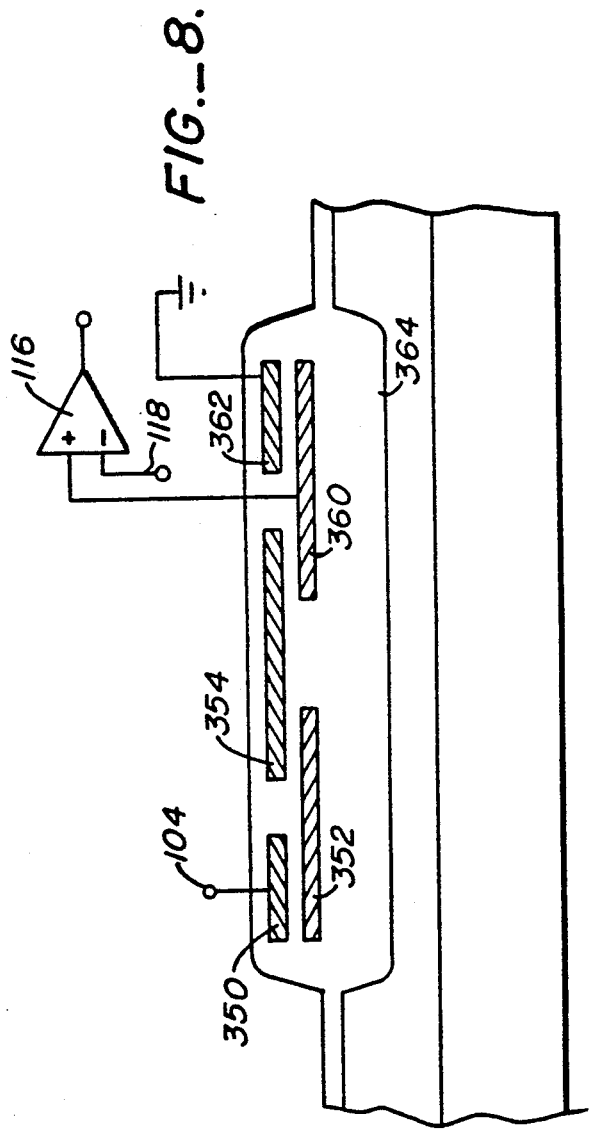
FIG._8.
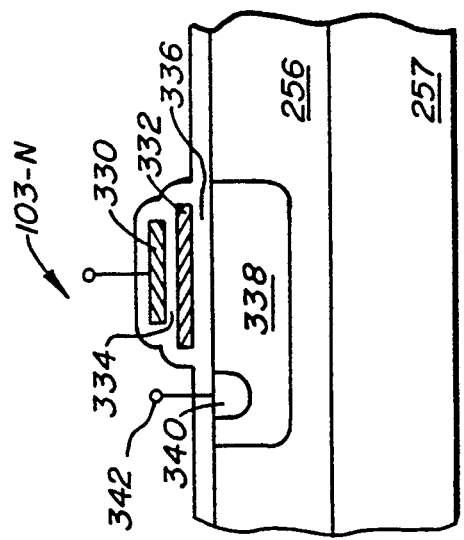
FIG._10.

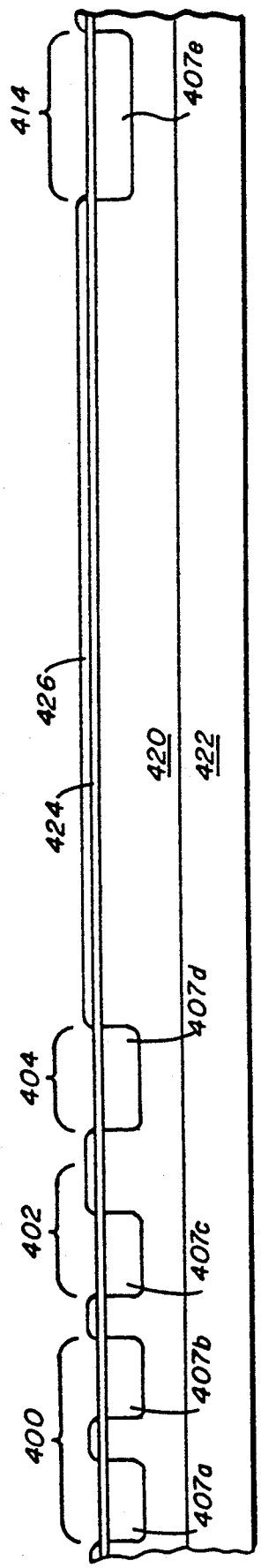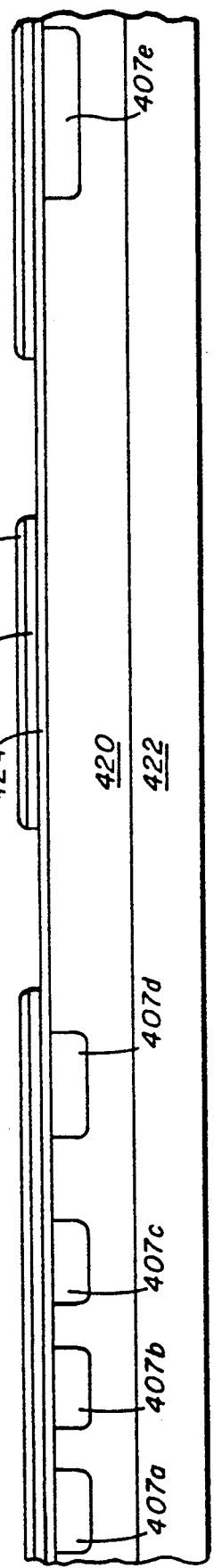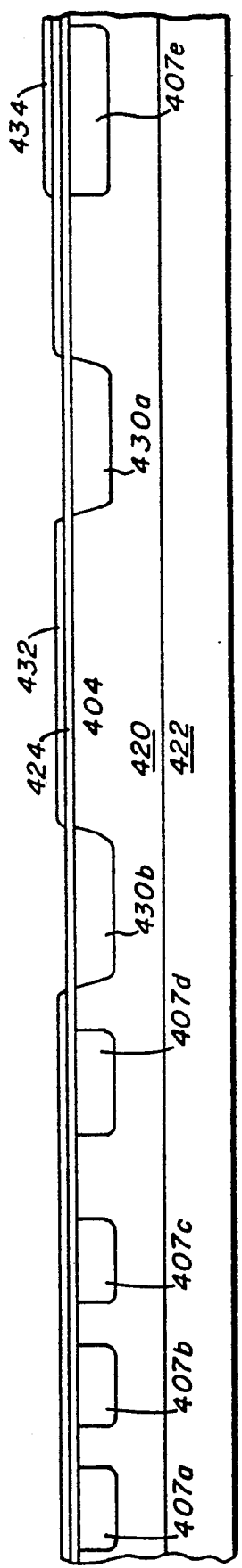

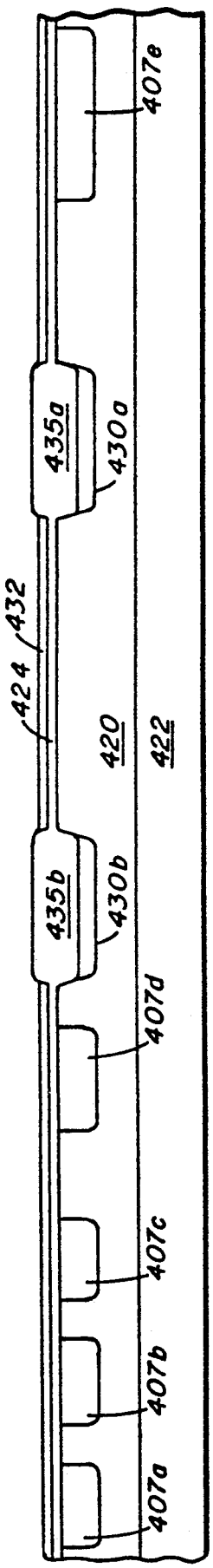
FIG._9d.
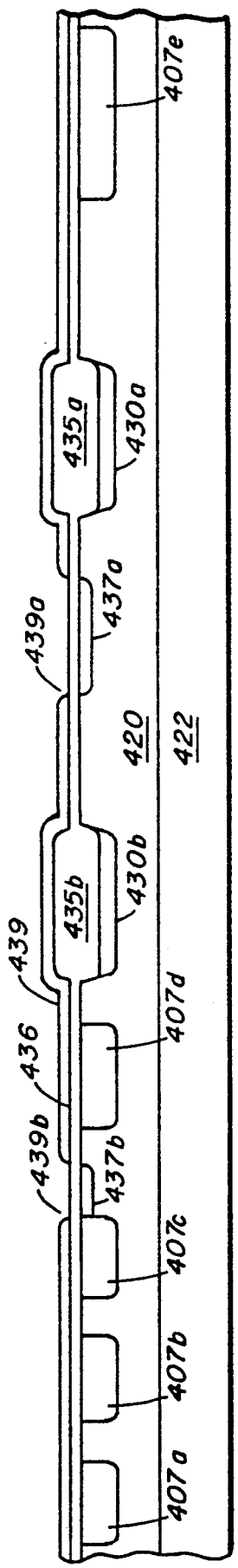
FIG._9e.
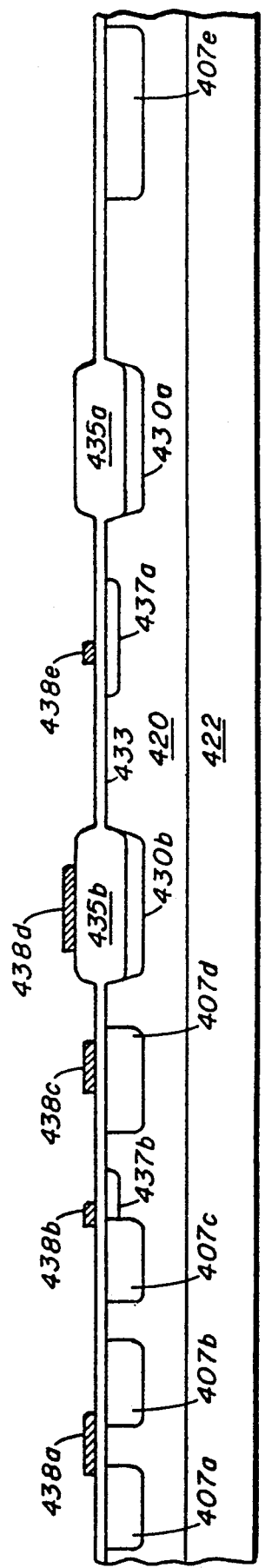
FIG._9f.

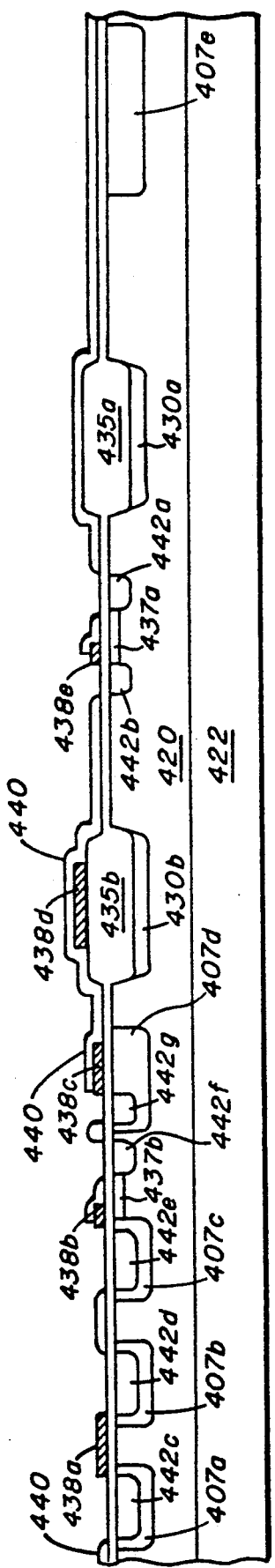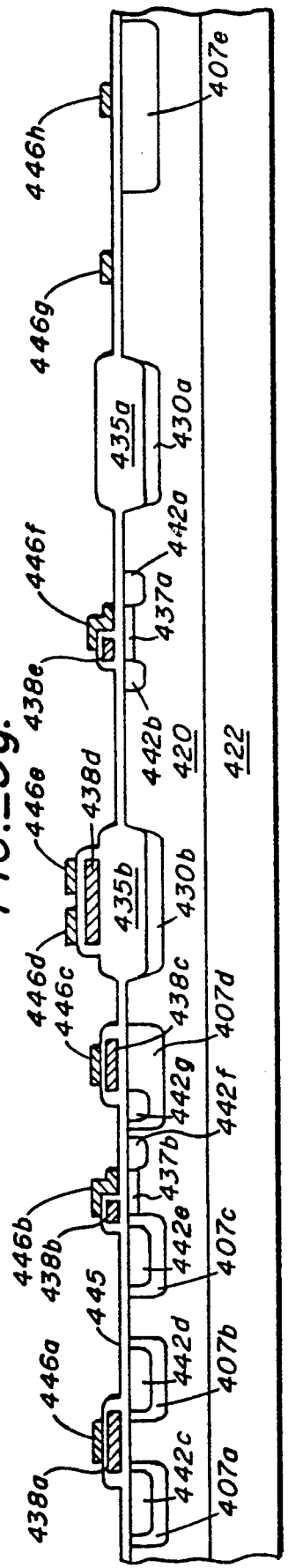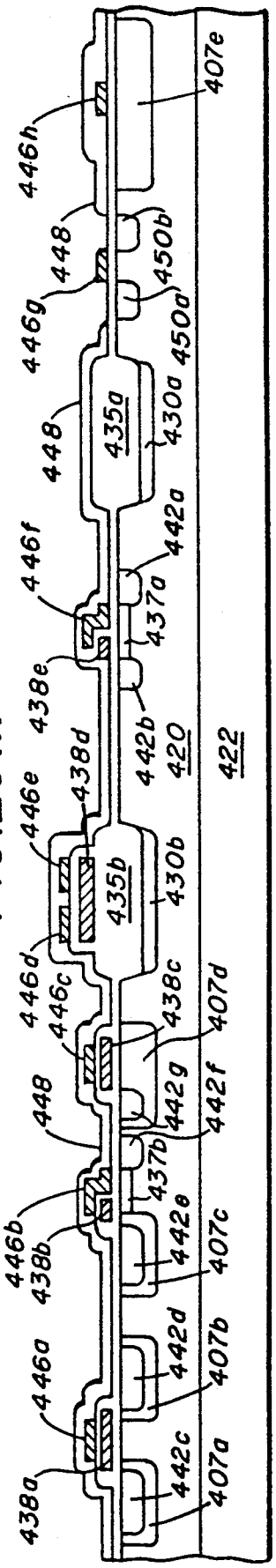

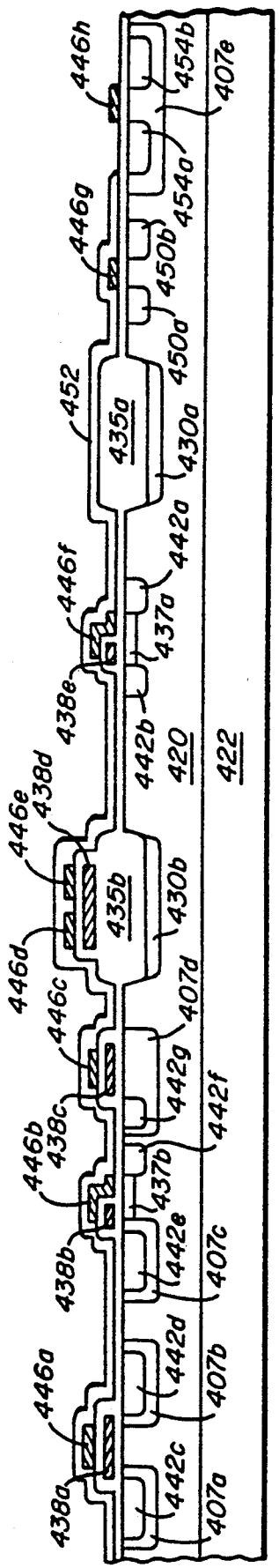
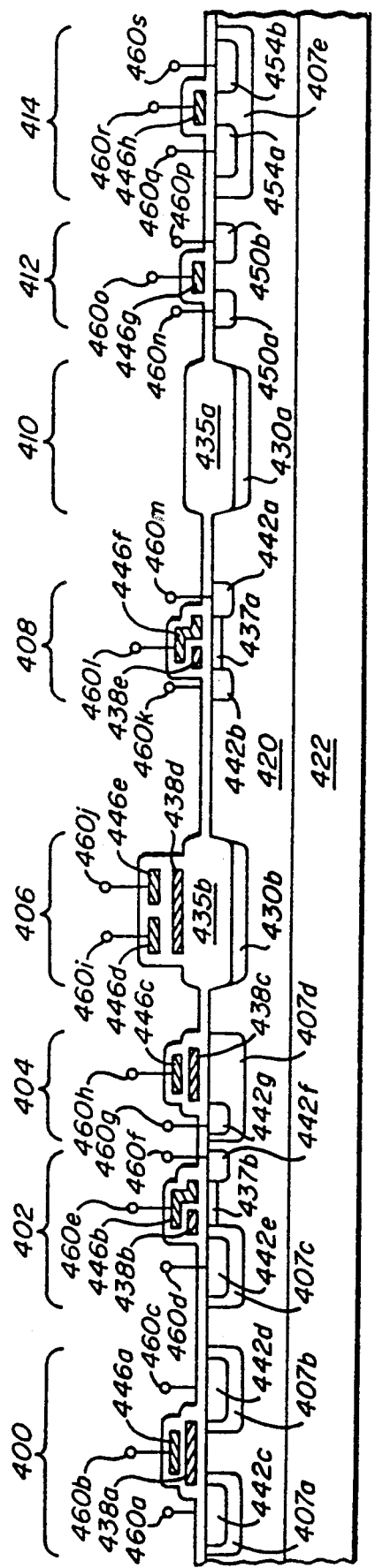
FIG._9j.
FIG._9k.

ON-CHIP HIGH VOLTAGE GENERATOR AND REGULATOR IN AN INTEGRATED CIRCUIT

BACKGROUND OF THE INVENTION

This invention relates to EEPROMs and more specifically to EEPROMs including voltage multiplier circuits.

There are a number of types of EEPROMS available on the market. One such EEPROM is described in U.S. Pat. No. 4,531,203 issued to Masuoka, et al. (incorporated herein by reference) and includes a transistor having a source, a drain, a floating gate, a control gate and an erase gate. During electrical erase, a low voltage is applied to the control gate, the source and the drain, and a high voltage (e.g. about 40 volts) is applied to the erase gate, thereby causing electrons to tunnel from the floating gate to the erase gate A similar EEPROM is discussed in U.S. Pat. No. 4,561,004, issued to Kuo et al., incorporated by reference.

In other EEPROM transistors, the floating gate is erased by causing electrons to tunnel from the floating gate to the drain. Unfortunately, this requires application of a high voltage (typically 16 to 25 volts) to the transistor drain. The high voltage required for electrically erasing a transistor with a floating gate-erase gate tunneling mechanism or a floating gate-drain tunneling mechanism can be generated from an external voltage source coupled to the EEPROM Unfortunately, such external voltage sources are expensive and therefore undesirable. To avoid having to provide an external high voltage power supply, it is known to generate the erase voltage on-chip using a voltage multiplier.

A typical voltage multiplier 8 is illustrated in FIG. 1, and includes an input lead 10 for receiving a relatively low input voltage $V_{IN}$ (e.g. about 5 volts) and an output lead 12 for providing an erase voltage $V_{OUT}$ (typically 20 to 40 V) in response to clock pulse pulses $\phi$ and . Circuits such as the one illustrated in FIG. 1 are also known as charge pumps.

The voltage multiplier of FIG. 1 is well known in the art, and is described, for example, in the article by Dickson et al. entitled "On-Chip High-Voltage Generation in MNOS Integrated Circuits Using an Improved Voltage Multiplier Technique," published in the IEEE Journal of Solid State Circuits in June, 1976, incorporated herein by reference.

One problem with voltage multiplier 8 is that transistors 14-1 to 14-N are exposed to and must therefore be capable of withstanding voltages of about 20 to 40 V without breaking down. Typical transistors used in LSI integrated circuits include a thin gate oxide (about 250Å) and shallow N+ source and drain regions (typically extending to a depth of about 0.3 to 0.4 microns). Application of a voltage in the range of 20 to 40 volts to such transistors typically causes the gate oxide to break down, thereby destroying the transistor, or causes the source-substrate or drain-substrate junction to break down. However, EEPROMs which generate the erase voltage on-chip must include transistors capable of withstanding high voltages. Such high voltage transistors include a thick gate oxide (e.g. in excess of 500Å) and source and drain regions having a deep junction depth (e.g. in excess of 0.7 to 0.8 microns). Unfortunately, such transistors take up a large surface area and are extremely slow. Thus, in the prior art, circuit designers were faced with the option of either having all of their transistors being large and slow, or using special process steps to provide some transistors designed to handle high voltages which were large and slow, and other transistors which did not include a thick oxide and deep junctions. The latter alternative required additional semiconductor processing steps and therefore the resulting devices were complicated and expensive to build.

It is also known in the art to provide circuits for regulating the output voltage provided by voltage multipliers. Unfortunately, such regulating circuits typically control the voltage multiplier output voltage to a value dependent on manufacturing process parameters and temperature. Thus, the erase voltage can vary from production lot to production lot, and can also vary in response to ambient temperature. Thus, despite the presence of the regulator circuit, the output voltage might be either too high (in which case it might stress or damage the transistors in the EEPROM circuit) or too low (in which case it will not erase the EEPROM).

SUMMARY OF THE INVENTION

A voltage multiplier constructed in accordance with our invention includes a novel MOS transistor capable of withstanding high voltages. We have discovered that the high voltage MOS transistor can be constructed without additional process steps compared to the steps used in prior art CMOS EEPROM devices by using to advantage the process steps already present in the CMOS EEPROM process. Rather than using a separate process step to form the source and drain regions of the N channel high voltage transistor, we form the source and drain region simultaneously with the formation of the N type wells in which P channel transistors of the CMOS circuit are to be formed. As a result, the source and drain regions have the same junction depth as the N- well (e.g. about 4 microns) but advantageously, also have an N- impurity concentration rather than a higher impurity concentration, thereby further enhancing the breakdown voltage of the junctions between the substrate and the source and drain regions.

As an additional feature of our invention, we have discovered that the field oxide normally formed in a CMOS integrated circuit can be used to fabricate high voltage capacitors (i.e. capacitors which will not breakdown under the high voltages produced by the voltage multiplier). This invention turns to advantage the thick field oxide by fabricating simultaneously with the fabrication of the floating gates of the memory transistors a floating conductive plate over the thick field oxide. Additional oxide is then formed over the floating plate simultaneously with the formation of oxide on the floating gates in the floating gate transistors and then second and third plates are formed above the first plate. Because the insulation between the second and third plates (which are capacitively coupled to each other via the first plate) is formed simultaneously during the formation of insulation of the floating gate on the memory cell transistors, the insulation above the first plate but under the second plate, and above the first plate but under the third plate is essentially the same thickness. Therefore, the effective insulation between the second plate and the third plate is the sum of these two insulation thicknesses or twice the thickness of the insulation between the second plate and the first plate or the third plate and the first plate alone.

The voltage multiplier in accordance with our invention also includes a regulator circuit for controlling the voltage multiplier output voltage to a selected value independently of process parameters or temperature. In one embodiment, the regulator circuit includes a reference voltage lead for providing a reference voltage and a comparator for comparing the reference voltage with a sense voltage proportional to the voltage multiplier output voltage. The comparator output signal controls the voltage multiplier. Of importance, the reference voltage is generated by a capacitive voltage divider which is temperature and process parameter insensitive. The capacitive voltage divider comprises a plurality of capacitors having a first plate coupled to the reference voltage lead and a second plate selectively coupled to receive either a first or second voltage. By causing the second plates of individual capacitors to receive either the first or second voltage, the reference voltage can be controlled to a selected value.

The reference voltage is typically set to a value by voltage trimming circuitry such that the voltage multiplier output voltage is sufficiently high to erase the EEPROM but not significantly higher. Thus, the erase voltage is not permitted to vary, and become so high as to stress or damage transistors in the EEPROM, or become so low as to prevent erasure of the EEPROM.

In one embodiment, the sense voltage is provided by a capacitive voltage divider coupled between the voltage multiplier output lead and ground. This provides a number of important advantages. For example, because a capacitive voltage divider is used, no DC current flows through the voltage divider to drop the output voltage. Further, because a voltage divider is used, the sense voltage is only equal to a fraction (in one embodiment, one fourth) of the voltage multiplier output voltage so the sense voltage can be compared with the reference voltage.

These and other advantages of the present invention are described in greater detail below.

BRIEF DESCRIPTION OF THE DRAWINGS

FIG. 1 schematically illustrates a prior art voltage multiplier.

FIG. 2 schematically illustrates a voltage multiplier constructed in accordance with one embodiment of our invention.

FIG. 2a schematically illustrates voltage multiplier constructed in accordance with another embodiment of our invention.

FIG. 3 schematically illustrates a circuit for controlling a programmable voltage regulator circuit.

FIGS. 4 and 5 illustrate in cross section and plan view, respectively, a first transistor capable of withstanding a high voltage without breaking down.

FIG. 6 illustrates in cross section a second high voltage transistor.

FIG. 7 illustrates in cross section a high voltage capacitor.

FIG. 8 illustrates in cross section a capacitive voltage divider.

FIG. 9a to 9k illustrate in cross section various semiconductor devices manufactured using a process in accordance with our invention.

FIG. 10 illustrates in cross section a high voltage capacitor constructed in accordance with an alternative embodiment of our invention.

FIG. 11 is a graph of the output voltage of the voltage multiplier of FIG. 2 versus time.

DETAILED DESCRIPTION

FIG. 2 schematically illustrates a voltage multiplier circuit 100 including an input lead 102 which receives a voltage $V_{PP}$ (typically about 12 volts). Voltage multiplier 100 also includes an output lead 104 which provides a voltage $V_{OUT}$ (typically a voltage between about 20 and 40 volts depending upon data stored in a nonvolatile register 106, described below). The voltage multiplier circuit 100 is part of an EEPROM which includes CMOS control circuitry and an array of floating gate transistors for storing data. Voltage $V_{OUT}$ is applied to the floating gate transistors to erase the floating gate transistors, e.g., by electron tunneling. Voltage $V_{PP}$ is the programming voltage used to store data in the EEPROM, e.g., by hot electron injection. However, in other embodiments of our invention, the voltage applied to input lead 102 is other than 12 volts, e.g. 5 volts. Also, in other embodiments of our invention, voltage $V_{OUT}$ is used to program as well as erase the floating gate transistors. In other embodiments, the voltage multiplier is not part of an EEPROM, but is used in an EAROM, EPROM or other type of circuit.

The portion of voltage multiplier 100 within dotted lines 103 functions in a manner similar to voltage multiplier 8 of FIG. 1.

It is noted that transistors 101-1 to 101-N of voltage multiplier circuit 100 are exposed to large voltages. In fact, in one embodiment, approximately 40 volts are applied across the gate oxide of transistor 101-N and across the drain-substrate and source-substrate junctions of transistor 101-N. Thus, in accordance with one feature of our invention, transistors 101-1 to 101-N are constructed so that they are capable of withstanding such voltages using conventional EEPROM process steps. FIGS. 4 and 5 illustrate one embodiment of transistor 101-N, it being understood that the other transistors within transistors 101-1 to 101-N are of like construction. (In an alternative embodiment, since transistor 101-1 is not exposed to extremely large voltages, transistor 101-1 can have a conventional structure. Other transistors in the earlier stages of the voltage multiplier can also have a conventional structure. However, the transistors in the last stages of the voltage multiplier must be able to withstand high voltages.)

Referring to FIGS. 4 and 5 it is seen that transistor 101-N includes a control gate 250 and a floating gate 252. Floating gate 252 and control gate 250 are formed concurrently with the floating gates and control gates of the EEPROM memory array. An insulation layer 254 is formed between floating gate 252 and underlying P- epitaxial layer 256 (which in turn is formed on a P+ substrate 257), and an insulation layer 258 is formed between floating gate 252 and control gate 250. Insulation layers 254 and 258 are formed concurrently with corresponding insulation layers in the EEPROM array, and have thickness of about 300Å and 550Å, respectively. Accordingly, the total insulation thickness between control gate 250 and epitaxial layer 256 is approximately 850Å. Such an oxide layer is capable of withstanding about 70 to 80 volts, even though the oxide layer is formed using conventional EEPROM process steps.

It is noted that control gate 250 does not cover a border region 252a at the periphery of floating gate 252. This is done so that if control gate 250 is misaligned relative to floating gate 252, portions of control gate 250 will not extend directly over the source or drain of transistor 101-N or epitaxial layer 256. This is important because if control gate 250 were misaligned relative to floating gate 252 so that control gate 250 extended over epitaxial layer 256, only a single insulation layer would separate control gate 250 from the epitaxial layer, and a large voltage would be present across that single insulation layer. Accordingly, to allow for misalignment between gates 250 and 252, transistor 101-N is designed so that control gate 250 does not extend over border region 252a of floating gate 252.

FIG. 5 illustrates transistor 101-N in plan view. As can be seen, floating and control gates 252 and 250 extend over an area 260. Field oxide (typically about 6000 to 7000Å thick) is formed in area 260 to minimize the capacitance between the portion of underlying P- epitaxial layer 256 in area 260 and floating and control gates 250 and 252. Control and floating gates 250 and 252 are extended over area 260 in such a manner as to adjust the ratio of the capacitive coupling between floating gate 252 and control gate 250 and the capacitive coupling between floating gate 252 and the remainder of the transistor. This is done because the transistor must be able to withstand application of 40 volts to control gate 250. It is desirable to ensure that appropriate portions of the 40 volts are applied across each of insulation layers 254 and 258. If most of the 40 volts were applied across insulation layer 258 (e.g. because of excessive coupling between gate 252 and epitaxial layer 256), insulation layer 258 could be damaged by application of such a large voltage. Similarly, if most of the 40 volts were applied across insulation layer 254 (e.g. because of excessive coupling between gates 250 and 252), insulation layer 254 could be damaged.

It is noted that a portion of 250a of control gate 250 extends past the edge of floating gate 252 and directly over field oxide 260. The portion of control gate 250 directly over field oxide 260 is typically electrically contacted by contact metallization (not shown). If a contact were formed over the portion of control gate 250 over floating gate 252, formation of this contact could damage or weaken the underlying structure.

Referring again to FIG. 4, transistor 101-N comprises a source region which includes an N- well 262. Formed in N-well 262 is an N+ region 264. Of importance, N+ region 264 is formed concurrently with the formation of N+ sources and drains of the floating gate transistors of the EEPROM memory array. (In another embodiment, N+ region 264 is formed concurrently with the N+ sources and drains in the CMOS control circuitry at the periphery of the EEPROM.) N- well 262 is formed concurrently with the N- wells used to form the P type transistors in the CMOS peripheral control circuitry of the EEPROM. Of importance, the breakdown voltage of the PN junction between N- well 262 and P-epitaxial layer 256 is greater than the breakdown voltage which would be exhibited between N+ region 264 and P-epitaxial layer 256 if N- well 262 did not exist. This is true in part because N- well 262 extends deeper into the semiconductor wafer than N+ region 264 and thus, the radius of curvature of the edge 262a of N- well 262 is greater than the radius of curvature of edge 264a of N+ region 264. (The depth of N- well 262 is typically greater than or equal to twice the depth of N+ region 264.) As is known in the art, PN junctions with a large radius of curvature have a greater breakdown voltage than PN junctions with a small radius of curvature, and therefore, the PN junction between N- well 262 and P-epitaxial layer 256 exhibits a high breakdown voltage (in one embodiment, about 80 volts). Also, the breakdown voltage of an N-/P- junction is greater than the breakdown voltage of an N+/P- junction of like geometry. In one embodiment, N- well 262 has a dopant concentration less than about 1% that of N+ region 264. Thus, the low doping concentration of N- well 262 also enhances the breakdown voltage of transistor 101-N.

As mentioned above, N+ region 264 is formed with N-well 262. Of importance, N+ region 264 facilitates electrical connection to source contact metallization 270, and also reduces the electrical resistance of the source of transistor 101-N.

The drain of transistor 101-N also includes an N- well 266 and therefore exhibits a similarly high PN junction breakdown voltage. N+ region 268 within well 266 similarly facilitates electrical connection to drain contact metallization 272 and reduces the electrical resistance of the drain.

In accordance with one feature of the present invention, transistors 101-1 to 101-N are selected to exhibit a low threshold voltage VT. In addition, transistors 101-1 to 101-N are designed such that there is only a small effect due to the source-substrate bias voltage on the transistor threshold voltage. (The effect due to the source-substrate bias on threshold voltage is known as the body effect.) Providing a low threshold voltage VT and a low body effect enhances the efficiency of the voltage multiplier by permitting more charge to be transferred by transistors 101-1 to 101-N each clock cycle. Maintaining a low threshold voltage and body effect is achieved by providing a low channel dopant concentration in transistors 101-1 to 101-N. This is accomplished using the manufacturing process described below.

Although transistor 101-N includes a floating gate and is subjected to high voltages, it is noted that floating gate 252 is not programmed during use, i.e. floating gate 252 does not become negatively charged. Programming is inhibited because the voltage across the drain and source is generally less than 5 V. Also, the presence of a large source-substrate reverse bias, and the use of highly resistive N- well 268 as the drain also inhibits programming.

Referring again to FIG. 2, it is seen that voltage multiplier 100 also includes a transistor 105 which is coupled to a control circuit 107. After electrical erase, it is desired to discharge lead 104, thereby bringing voltage $V_{OUT}$ to ground. Thus, after electrical erase, control circuit 107 turns on transistor 105, thereby discharging lead 104. Because 40 volts is applied across transistor 105, it is necessary to ensure that transistor 105 is capable of withstanding this voltage. Although a transistor having a structure such as illustrated in FIGS. 4 and 5 would accomplish this task, in accordance with one embodiment of our invention, transistor 105 has a structure such as illustrated in FIG. 6. Transistor 105 of FIG. 6 is similar to transistor 101-N except since source 300 is tied to ground, and the junction voltage between source 300 and epitaxial layer 256 is substantially 0 volts, it is not necessary to form source 300 in an N- well. However, since the drain-epitaxial layer junction of transistor 105 must withstand a voltage in excess of 40 V, the drain of transistor 105 comprises an N- well 302 surround an N+ region 304.

As seen in FIG. 6, transistor 105 employs a splitgate architecture such that floating gate 305 of transistor 105 covers a first portion 306 of the transistor channel but not a second portion 307 of the channel. This provides an important advantage, because there is usually some capacitive coupling between drain 308 of transistor 105 and floating gate 305. Thus, as voltage $V_{OUT}$ at drain 308 increases, the voltage at floating gate 305 increases, and an inversion region in portion 306 of the channel can form. However, because floating gate 305 does not extend over the entire channel of transistor 105, the inversion region does not extend from the source to the drain of transistor 105, and thus transistor 105 will not turn on unless the voltage at control gate 309 increases. This is important because if transistor 105 were permitted to conduct current because of drain-floating gate capacitive coupling, even a small amount of current through transistor 105 could significantly drop output voltage $V_{OUT}$.

Referring again to FIG. 2, it is seen that capacitors 103-1 to 103-N are also typically exposed to large voltages. Accordingly, FIG. 7 illustrates capacitor 103-N which is constructed to be able to withstand a voltage of about 70 to 80 volts (although in use, capacitor 103-N is not exposed to voltages in excess of 40 V). Referring to FIG. 7, it is seen that capacitor 103-N includes a floating gate 310 formed on a thick field oxide region 312 (e.g., 6000 to 7000Å thick). An insulation layer 314 is formed in floating gate 312, a first control gate 316 is formed on a first portion of insulation layer 314, and a second control gate 318 is formed on a second portion of insulation layer 314. Control gates 316 and 318 serve as first and second plates, respectively, of capacitor 103-N. Of importance, floating gate 310 is capacitively coupled to gates 316 and 318. Because the effective insulation between gates 316 and 318 is twice the insulation thickness of insulation layer 314 (i.e., an effective thickness of about 1100Å), capacitor 103-N is capable of withstanding large voltages. Further, because of the thickness of field oxide region 312, the oxide between gate 310 and epitaxial layer 256 is also capable of withstanding high voltages without breaking down.

FIG. 10 illustrates in cross section a second embodiment of a high voltage capacitor which can be used for capacitor 103-N. As can be seen, the capacitor of FIG. 10 also includes a control gate 330, a floating gate 332, insulation 334 formed between control gate 330 and floating gate 332 and insulation 336 between floating gate 332 and an underlying N- well 338. Control gate 330 and N- well 338 serve as first and second plates, respectively, of capacitor 103-N. An N+ region 340 formed in N- well 338 facilitates electrical contact to contact metallization 342. The effective oxide insulation between control gate 330 and N-well 338 is thick, e.g. about 850Å, and is therefore capable of withstanding high voltages. The junction between N- well 338 and epitaxial layer 256 has a large radius of curvature and thus a high breakdown voltage.

Voltage multiplier 100 includes capacitors 110-1 to 110-4 (the function of which is described below), which are coupled between output lead 104 and ground. Thus, the plates of capacitor 110-1 are also exposed to large voltages. FIG. 8 illustrates in cross section capacitors 110-1 to 110-4 adapted to withstand high voltages. Lead 104 is coupled to a control gate 350 which serves as the first plate of capacitor 110-1. Control gate 350 is capacitively coupled to a floating gate 352, which serves as the second plate of capacitor 110-1 and the first plate of capacitor 110-2. A control gate 354 extends over and is capacitively coupled to floating gate 352. Gate 354 serves as the second plate of capacitor 110-2 and the first plate of capacitor 110-3. Gate 354 extends over floating gate 360 which serves as the second plate of capacitor 110-3 and the first plate of capacitor 110-4, and is also connected to the non-inverting input lead of an inverter 116 (also illustrated in FIG. 2 and described below). Control gate 362 serves as the second plate of capacitor 110-4 and is connected to ground. Floating gates 352 and 360 are formed on field oxide layer 364.

In accordance with one novel feature of our invention, a voltage regulator circuit 108 is coupled to output lead 104 to ensure that voltage $V_{OUT}$ is at a desired value which is independent of temperature and process parameters. Voltage regulator 108 includes capacitors 110-1 to 110-4 coupled in series between output lead 104 and a ground terminal 112. Capacitors 110-1 to 110-4 all have a substantially identical capacitance, and serve as a capacitive voltage divider so that the voltage at a node 114 (between capacitors 110-3 and 110-4) is at a voltage equal to voltage $V_{OUT}/4$. Node 114 is connected to the non-inverting input lead of a comparator 116. The inverting input lead of comparator 116 is connected to a lead 118 which receives a reference voltage $V_{REF}$. Comparator 116 compares voltage $V_{OUT}$ with voltage $V_{REF}$ and generates a binary output signal on an output lead 119 in response thereto. Lead 119 is connected to a NAND gate which is part of ring oscillator circuit 124. When the signal at lead 119 is high, ring oscillator 124 oscillates and provides output signals $\phi$ and to the voltage multiplier. Thus, if the signal at lead 114 is less than voltage $V_{REF}$, ring oscillator 124 generates clock signals $\phi$ and , and thus voltage multiplier 100 will increase voltage $V_{OUT}$ at lead 104. However, as soon as voltage $V_{OUT}/4$ is greater than voltage $V_{REF}$, the signal at output lead 119 goes low, ring oscillator 124 stops oscillating and voltage multiplier 100 stops increasing voltage $V_{OUT}$. Thus, the EEPROM of the present invention includes a voltage regulator which permits voltage $V_{OUT}$ to be accurately controlled.

FIG. 11 illustrates the relationship between voltage $V_{OUT}$ and time when voltage multiplier 100 turns on. As can be seen, voltage $V_{OUT}$ increases with time until voltage $V_{OUT}/4$ exceeds $V_{REF}$, at which time, oscillator 124 ceases oscillation, and voltage $V_{OUT}$ stops increasing.

As mentioned above, comparator 116 compares voltage $V_{OUT}/4$ with voltage $V_{REF}$. Because the capacitive voltage divider divides voltage $V_{OUT}$ by four, comparator 116 need not have to withstand high voltages. Also, it is necessary to generate a sense voltage on lead 114 which is a fraction of voltage $V_{OUT}$ so that the sense voltage can be compared with voltage $V_{REF}$.

Also as mentioned above, lead 118 provides voltage $V_{REF}$ to comparator 116. In one embodiment, lead 118 is coupled to voltage $V_{PP}$ (as mentioned above, typically 12 volts) via parallel-coupled capacitors 120-1 to 120-20 and to ground via parallel-coupled capacitors 122-1 to 122-10. Lead 118 is also coupled to a plate of each of capacitors 124-1 to 124-10. The second plate of capacitors 124-1 to 124-10 is connected to either ground or voltage $V_{PP}$ via switches 126-1 to 126-10, which are part of a switching network 128. (Capacitors 120-1 to 120-20, 122-1 to 122-10 and 124-1 to 124-10 have the same capacitance C.) The state of switches 126-1 to 126-10 is controlled by the contents of register 106, described in greater detail below. The network including capacitors 120-1 to 120-20, 122-1 to 122-10, 124-1 to 124-10 and switching network 128 controls voltage $V_{REF}$ to a desired value. When the EEPROM is first tested after wafer fabrication, register 106 contains the value zero, and switches 126-1 to 126-10 connect capacitors 124-1 to 124-10 to ground. Thus, voltage $V_{REF}$ can be calculated as follows:

$$V_{REF} = V_{PP}(20C/40C) = V_{PP}/2 = 6V. \quad (1)$$

Thus, comparator 116 compares voltage $V_{OUT}/4$ with voltage $V_{PP}/2$, and causes voltage multiplier 100 to increase voltage $V_{OUT}$ until voltage $V_{OUT}$ reaches voltage $V_{PP} \times 2$ (or about 24 V). The EEPROM is tested to determine if 24 V is sufficient to erase the EEPROM.

If voltage $V_{PP} \times 2$ is insufficient to serve as an erase voltage, the contents of register 106 are changed, thereby causing one of switches 126-1 to 126-10 to change state. If one of switches 126-1 to 126-10 changes state, voltage $V_{REF}$ changes to a value as follows:

$$V_{REF} = V_{PP}(21/40). \quad (2)$$

Thus, if voltage $V_{PP}$ is 12 volts, voltage $V_{REF}$ increases from 6 volts to 6.3 volts, and voltage $V_{OUT}$ changes from 24 volts to 25.2 volts. If it is determined that 25.2 volts is too low to erase the floating gate transistors of the EEPROM, the contents of register 106 are again changed to thereby change the state of another one of switches 126-1 to 126-10. This causes voltage $V_{REF}$ to again increase, this time to a value as follows:

$$V_{REF} = V_{PP}(22/40). \quad (3)$$

This process continues until a voltage is selected which is sufficient for erasing the EEPROM. Thereafter, the contents of nonvolatile register 106 are no longer changed, and the EEPROM is erased with the selected voltage. By limiting voltage $V_{OUT}$ to a voltage large enough to erase the EEPROM but not greater, the transistors exposed to voltage $V_{OUT}$ will not be excessively stressed.

The above-described voltage regulator provides a number of important advantages. First, as can be seen in equations 1 to 3, voltage $V_{REF}$ is independent of capacitance C. Thus, if capacitors 120-1 to 120-20, 122-1 to 122-10 or 124-1 to 124-10 are made either too large or too small (e.g. because of underetching or overetching the polysilicon capacitor plates during manufacturing), voltage $V_{REF}$ does not change. Thus, voltage $V_{REF}$ is insensitive to processing conditions. More importantly, voltage $V_{REF}$ is insensitive to temperature.

It is also noted that capacitors 120-1 to 120-20, 122-1 to 122-10 and 124-1 to 124-10 all have the same capacitance and shape. Thus, if they are overetched or underetched, their capacitances are affected equally.

It is noted that in the above-described embodiment, voltage $V_{OUT}$ is a value between 24 and 36 volts, and can be adjusted in 1.2 V steps. However, in other embodiments, voltage $V_{OUT}$ can be varied over other voltage ranges, as desired, with different incremental voltage steps. This can be done, for example, selecting different numbers of capacitors and by using voltages other than 12 V and/or ground in the capacitive voltage divider.

In accordance with another novel feature of our invention, lead 118 is coupled to the output lead of comparator 116 via a capacitor 127 (FIG. 2a). Thus, if voltage $V_{OUT}$ is high enough to halt oscillator 127, the voltage at the output lead of comparator 116 drops, thereby causing a slight drop in voltage $V_{REF}$. If voltage $V_{OUT}$ falls to a sufficiently low value, the output voltage of comparator 116 rises thus causing a slight increase in voltage $V_{REF}$. Thus, the regulator circuit of FIG. 2a exhibits hysteresis, and small variations in voltage $V_{OUT}$ will not cause voltage multiplier 103 to turn on and off. In yet another embodiment, comparator 116 drives another output lead (not shown) with the logical inverse of the signal at lead 119, and this other output lead is capacitively coupled to lead 114 so that when comparator 116 changes state, the voltage at lead 114 shifts slightly. This causes the regulator circuit to exhibit hysteresis, and thus comparator 116 will not change state in response to extremely small variations in voltage $V_{OUT}$.

In accordance with one novel feature of our invention, register 106 is a nonvolatile memory register designed to consume essentially zero power. FIG. 3 schematically illustrates a single memory cell 150 for storing a bit of data within register 106 which controls switch 126-1. Switch 126-1 is also illustrated in FIG. 3. The other memory cells in register 106 and switches in switching network 128 are identical to memory cell 150 and switch 126-1 in FIG. 3. Referring to FIG. 3, switch 126-1 includes an output lead 152 for connecting capacitor 124-1 to either voltage $V_{PP}$ (via transistors 154 and 156) or to ground (via transistors 158 and 160), depending on data stored in a floating gate transistor 162 within memory cell 150.

The control gate of floating gate transistor 162 receives 5 volts. Therefore, if the threshold voltage of transistor 162 is low (e.g. because the floating gate transistor 162 is electrically neutral), the voltage at a node 164 is low. Node 164 is coupled to an inverter 166 which drives a node 168 with a high voltage. Nodes 164 and 168 are coupled to the gates of P channel transistors 154 and 158 and N channel transistors 156 and 160 such that when the voltage at node 164 is high and the voltage at node 168 is low, transistors 158 and 160 are on and connect capacitor 124-1 to ground while transistors 154 and 156 are off. In contrast, when the threshold voltage of transistor 162 is high (e.g. because the floating gate of transistor 162 is negatively charged), transistor 162 is off, the voltage at node 164 is high, the voltage at node 168 is low, and transistors 154 and 156 are on, thereby connecting capacitor 124-1 to voltage $V_{PP}$. In this way, the circuit of FIG. 3 connects either voltage $V_{PP}$ or ground to capacitor 124-1, depending on the state of floating gate transistor 162.

In accordance with one embodiment of our invention, memory cell 150 does not consume power. This is true in part because a P channel transistor 180 is coupled in series with floating gate transistor 162 between $V_{CC}$ pad 182 and ground. P channel transistor 180 is driven by inverter 166. Thus, if transistor 162 is on, the voltage at node 164 is low, the voltage at node 168 is high, and therefore transistor 180 turns off, and there is no current path between voltage $V_{CC}$ and ground. Similarly, if transistor 162 is off, the voltage at node 164 is high, the voltage at node 168 is low, and therefore transistor 180 turns on, thereby coupling node 164 to $V_{CC}$ pad 182. However, since transistor 162 is off, there is still no current path between $V_{CC}$ and ground. Thus, essentially no power is consumed by cell 150.

It is noted that node 168 is also coupled to ground via an N channel transistor 184 which is driven by a $V_{CC}$ sense circuit 186. Normally, $V_{CC}$ sense circuit 186 provides a low output voltage, thereby turning off transistor 184 and thus normally transistor 184 does not affect operation of cell 150. However, during power up, when $V_{CC}$ is ramping up from 0 volts to 5 volts, $V_{CC}$ sense circuit 186 provides a high output voltage, thereby causing N channel transistor 184 to remain on until voltage $V_{CC}$ reaches about 3 volts. This is done because when cell 150 initially powers up, the various nodes power up in an indeterminate state. If the threshold voltage of transistor 162 were high, and inverter 166 powered up such that it was driving node 168 with a high voltage, transistor 180 would remain off, transistor 162 would remain off, and node 164 would power up in a randomly selected state. By providing $V_{CC}$ sense circuit 186 and N channel transistor 184, transistor 180 is forced to initially turn on during power up (until voltage $V_{CC}$ reaches 3 volts), thereby causing the voltage at node 164 to go high and the voltage at node 168 to go low. Thereafter, when transistor 184 turns off, if the threshold voltage of transistor 162 is high, the voltage at node 164 will remain high and the voltage at node 168 will remain low. However, if the threshold voltage of transistor 162 is low, the voltage at node 164 will drop to ground, the voltage at node 168 will rise to $V_{CC}$, and transistor 180 will turn off. Thus, sense circuit 186 and N channel transistor 184 ensure that cell 150 does not power up in an indeterminate state.

Also illustrated in FIG. 3 is a data input pad 188 and a control circuit 190. Data input pad 188 and control circuit 190 are used to program transistor 162 during testing of the EEPROM as described above. During programming of transistor 162, 12 volts are applied to the gate and drain of transistor 162.

A semiconductor process used to form an EEPROM including a voltage multiplier in accordance with our invention is described below in relation to FIGS. 9a to 9k. FIGS. 9a to 9k illustrate in cross section the various structures in an EEPROM constructed in accordance with our invention, including a transistor 400 (FIG. 9k) having the same structure as transistors 101-1 to 101-N, a transistor 402 having the same structure as transistor 105, a capacitor 404 having the same structure as the capacitor of FIG. 10, a capacitor 406 having the same structure as the capacitor 103-N of FIG. 7, an EEPROM floating gate transistor 408 for storing data, field oxide region 410, an N channel transistor 412 which is part of the CMOS peripheral control circuitry of the EEPROM, and a P channel transistor 414 which is part of the CMOS peripheral control circuitry. The structures illustrated in FIGS. 9a to 9k are typically not adjacent to one another, but are merely shown in that manner to better illustrate how they are formed by the process steps described herein. (Capacitors 110-1 to 110-4, illustrated in FIG. 8, are formed in a manner similar to capacitors 103-N of FIG. 7. Thus, capacitors 110-1 and 110-4 are not illustrated in FIGS. 9a to 9k.)

1. As illustrated in FIG. 9a, a P- epitaxial layer 420 is grown on a P+ substrate 422. In one embodiment, layer 420 has a dopant concentration of $10^{15}$/cc. A first silicon dioxide layer 424 is then grown on the P- epitaxial layer 420.

2. A photomask 426 is formed on first silicon dioxide layer 424 and N type impurities are implanted into P- epitaxial layer 420 to form the N- wells used as the source and drain of to-be-formed transistor 400 (e.g. source 407a and drain 407b), the drain of transistor 402 (drain 407c), N- well 407d used to form capacitor 404, and N- well 407e used to form P channel transistor 414 in the peripheral CMOS control circuitry. Photomask 426 is then removed.

3. A $Si_3N_4$ layer 432 is then formed on the wafer, e.g by chemical vapor deposition (FIG. 9b). A photomask 433 is applied to the wafer and patterned to expose portions of $Si_3N_4$ layer 432 where field oxide is to be formed. The exposed portions of $Si_3N_4$ layer 432 are then removed.

4. Photomask 433 is removed and the wafer is covered with a photomask 434 which is patterned as illustrated in FIG. 9c. The wafer is then subjected to a first field implantation process in which the implanted ions do not have sufficient energy to pass through $Si_3N_4$ layer 432. Thus, ions are only implanted into the areas where $Si_3N_4$ layer 432 has been removed. In one embodiment, P type ions such as boron ions are implanted at a dosage of $5 \times 10^{13}$/cm$^2$ and an implementation energy of 15 KeV during this step, thereby forming regions 430a and 430b of enhanced P type dopant concentration. Thereafter, the wafer is subjected to a second implantation step in which the ions have sufficient energy to pass through $Si_3N_4$ layer 432 but not through photomask 434. During this step, boron is typically implanted with a dosage of $10^{13}$/cm$^2$ and an implant energy of 180 KeV. Of importance, during the second implantation step, ions are implanted into the entire wafer except where P channel transistor 414 is to be formed.

5. Photomask 434 is removed and field oxide layers 435a and 435b are thermally grown in the areas where $Si_3N_4$ layer 432 has been removed (FIG. 9d).

6. Referring to FIG. 9e, $Si_3N_4$ layer 432 is removed, e.g. by placing the wafer in phosphoric acid. Silicon dioxide layer 424 is then removed, e.g. by placing the wafer in an HF solution. Of importance, because of the thickness of field oxide 435a and 435b, only an insignificant portion of the field oxide is removed during this step. A new silicon dioxide layer 436 is then thermally grown on the wafer.

7. A photomask 439 (FIG. 9e) is applied to the wafer and patterned to form window region 439a and 439b and the wafer is subjected to a PROM implant (using P type impurities) to adjust the dopant concentration in regions 437a and 437b where the channel of EEPROM transistor 408 and transistor 402 are to be formed. This is done to adjust the threshold voltage of to-be-formed EEPROM transistor 408 and transistor 402. Photomask 439 is then removed.

8. Referring to FIG. 9f, a first doped polysilicon layer is deposited on the wafer by chemical vapor deposition and then patterned in a conventional manner to form floating gates 438a to 438e.

9. A photomask 440 is applied to the wafer and patterned and N+ source region 442a and drain region 442b of to-be-formed EEPROM floating gate transistor 408 are formed by ion implantation (FIG. 9g). It is noted that an edge of drain region 442b is self-aligned with an edge of floating gate 438e of to-be-formed transistor 408. This is done for reasons described in U.S. Pat. No. 4,639,893, issued to Boaz Eitan on Jan. 27, 1987, incorporated herein by reference. N+ regions 442c to 442f within transistors 400 and 402 and N+ region 442g within capacitor 404 are also formed at this time. Photomask 440 is then removed. (Regions 442c and 442d are self-aligned with gate 438a, but do not come into contact with the P- material of epitaxial layer 420 because N- wells 407a and 407b extend a greater distance under gate 438a than the distance N+ regions 442c and 442d extend under gate 438a.)

10. Silicon dioxide layer 433 is removed except the portion of layer 433 covered by floating gates 438a to 438e, e.g. by placing the wafer in an HF solution. Because of the thickness of field oxide 435a and 435b, only an insignificant portion of the field oxide is removed during this step. The wafer is removed from the HF solution and a new silicon dioxide layer 445 is thermally grown on the wafer.

11. A photomask (not shown) is applied to the wafer and a threshold voltage adjust implant is performed to adjust the threshold voltage of subsequently formed N channel transistor 412 of the CMOS control circuitry. The photomask is then removed and another photomask (not shown) is applied to the wafer. The wafer is then subjected to another implantation step to adjust the threshold voltage of to-be-formed P channel transistor 414. The photomask is then removed. It is noted that transistor 400 does not receive any ions during threshold adjust implantation applied to the CMOS transistors or the PROM implantation applied to the EEPROM transistor 408 (see step 7. above). Thus, the channel of transistor 400 has a low dopant concentration, and thus transistor 400 exhibits a low threshold voltage and body effect.

12. Referring to FIG. 9h, a second doped layer of polysilicon is deposited by chemical vapor deposition on the wafer and then patterned, thereby forming control gates 446a to 446f. Of importance, the second doped polysilicon layer is also used to form gates 446g and 446h of to-be-formed transistors 412 and 414. (In another embodiment, 446a to 446h include a layer of polysilicon covered with a silicide layer such as tungsten silicide.)

13. The wafer is covered by a photoresist layer 448 which is patterned to define a window region where source region 450a and drain region 450b of N channel transistor 412 is to be formed (FIG. 9a). The wafer is then subjected to an ion implantation process to thereby form source 450a and drain 450b. (As described above, the N+ regions within transistor 400 and 402 and capacitor 404 are formed concurrently with N+ regions 442a and 442b. However in another embodiment, the N+ regions of transistors 400 and 402 and capacitor 404 are formed concurrently with source and drain regions 450a and 450b.)

14. Photoresist layer 448 is removed and the wafer is covered with a photoresist layer 452 which is patterned to define a window region where source 454a and drain 454b are to be formed (FIG. 9j). The wafer is then subjected to an implantation process to form P type source and drain regions 454a and 454b of transistor 414. Photomask 452 is then removed.

15. A thick passivation layer of silicon dioxide is deposited on the wafer, e.g. by chemical vapor deposition. A contact mask is applied to the wafer (not shown). Contacts are then etched in the passivation layer.

16. Contact metallization is deposited on the wafer and then patterned to form electrical contacts, schematically illustrated as contacts 460a to 460s in FIG. 4k.

17. A second passivation layer of silicon dioxide (not shown) is formed on the wafer.

It will be appreciated that using conventional EEPROM processing steps described above, high voltage transistors 400 and 402, and high voltage capacitors 404 and 406 are formed. Thus, the process flow of the present invention has the advantage of providing high voltage structures and convention low voltage structures in a single integrated circuit without requiring additional process steps. Thus, high voltages (e.g. 20 to 40 V) can be generated and handled on-chip without requiring additional process steps, and without requiring all transistors in the EEPROM to be large and slow.

While the invention has been described with regard to a specific embodiment, those skilled in the art will recognize that changes can be made in form and detail without departing from the spirit and scope of the invention. Accordingly all such changes come within the present invention.

We claim:

1. An integrated circuit including a voltage supply comprising:
   first means for providing an output voltage on an output lead;
   a first lead for receiving a first voltage;
   a plurality of capacitors coupled in series between said output lead and said first lead, said plurality of capacitors serving as a voltage divider;
   a second lead coupled to a node between two of the capacitors within said plurality, said second lead providing a sense voltage responsive to said output voltage;
   second means for providing a reference voltage, said first means comprising means for comparing said sense voltage and said reference voltage and adjusting said output voltage in response thereto.

2. The circuit of claim 1 wherein said plurality capacitors comprises:
   an insulating layer;
   a first plurality of conductive layers formed over said insulating layer, each conductive layer within said plurality serving as a plate of at least one of said capacitors within said plurality of capacitors;
   a second plurality of conductive layers, a first one of said conductive layers within said second plurality serving as a first plate of a first capacitor within said plurality of capacitors and being formed over but insulated from a first portion of a first conductive layer within said first plurality, said first conductive layer within said first plurality serving as the second plate of said first capacitor and a first plate of a second capacitor within said plurality of capacitors, a second conductive layer within said second plurality of conductive layers being formed over a second portion of said first conductive layer within said first plurality and serving as a second plate of said second capacitor, said second conductive layer within said second plurality extending over but being insulated from at least a portion of a second conductive layer within said first plurality and serving as a first plate of a third capacitor within said plurality of capacitors, said second conductive layer within said first plurality serving as a second plate of said third capacitor.

3. The circuit of claim 1 wherein said first lead is oupled to ground.

4. An integrated circuit comprising a voltage multiplier, said voltage multiplier comprising:
   a first input terminal for receiving a first input voltage;
   an output terminal for providing output voltage;
   voltage means for generating said output voltage from said input voltage;
   a second input terminal for receiving a second input voltage;

a third input terminal for receiving a third input voltage;

a capacitive voltage divider coupled between said second and third input terminals for generating a reference signal on a reference lead in response to said second and third input voltages, said capacitive voltage divider comprising a plurality of capacitors having a first plate coupled to said reference lead;

a plurality of switches, each switch having a lead coupled to the second plate of a uniquely associated one of said capacitors, each switch electrically coupling said second plate of said uniquely associated capacitor to either said second input terminal or said third input terminal;

means for providing a sense signal having a magnitude responsive to said output voltage; and means for comparing said reference signal and said sense signal and generating therefrom a comparator output signal, said voltage means adjusting said output voltage in response to said comparator output signal.

5. The circuit of claim 4 wherein said first input voltage equals said second input voltage.

6. The circuit of claim 4 further comprising a register, the state of said switches being determined by data stored in said register.

7. A capacitor comprising:
a first region of semiconductor material of a first conductivity type;
a second region of semiconductor material of a second conductivity type opposite said first conductivity type formed within said first region, said second region serving as a first plate of said capacitor;
a first conductive layer formed above but insulated from said second region; and
a second conductive layer formed above but insulated from said first conductive layer, said second conductive layer serving as a second plate of said capacitor.

8. The capacitor of claim 7 wherein said capacitor is part of a circuit comprising:
a third region of said second conductivity type formed within said first region, said second region extending to substantially the same depth as said third region;
a source region of said first conductivity type formed within said third region;
a drain region of said first conductivity type formed within said third region, a channel extending between said source and drain regions; and
a gate formed above said channel region.

9. A capacitor comprising:
a first insulating layer;
a first conductive layer formed on said first insulating layer;
a second insulating layer formed on said first conductive layer;
a second conductive layer formed on a first portion of said second insulating layer but not on a second portion of said second insulating layer, said second conductive layer serving as a first plate of said capacitor; and
a third conductive layer formed on said second portion of said second insulating layer, said third conductive layer serving as a second plate of said capacitor.

10. The capacitor of claim 9 wherein said capacitor is part of a voltage multiplier in an integrated circuit.

11. The capacitor of claim 10 wherein said first insulating layer is part of the field insulation of an integrated circuit.

* * * * *